United States Patent
Aoki (10) Patent No.: US 10,886,134 B2
(45) Date of Patent: Jan. 5, 2021

(54) POLISHING METHOD

(71) Applicant: SHIN-ETSU HANDOTAI CO., LTD., Tokyo (JP)

(72) Inventor: Kazuaki Aoki, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/625,082

(22) PCT Filed: Jun. 22, 2018

(86) PCT No.: PCT/JP2018/023760
§ 371 (c)(1),
(2) Date: Dec. 20, 2019

(87) PCT Pub. No.: WO2019/012949
PCT Pub. Date: Jan. 17, 2019

(65) Prior Publication Data
US 2020/0152471 A1   May 14, 2020

(30) Foreign Application Priority Data
Jul. 14, 2017 (JP) ................. 2017-137796

(51) Int. Cl.
*H01L 21/306* (2006.01)
*B24B 37/04* (2012.01)
(Continued)

(52) U.S. Cl.
CPC .......... *H01L 21/30625* (2013.01); *B24B 1/00* (2013.01); *B24B 37/042* (2013.01);
(Continued)

(58) Field of Classification Search
None
See application file for complete search history.

(56) References Cited

U.S. PATENT DOCUMENTS

2003/0022495 A1* 1/2003 Netsu ............... H01L 21/02024
                                                              438/689
2008/0053001 A1 3/2008 Noguchi et al.
(Continued)

FOREIGN PATENT DOCUMENTS

JP   2005-303060 A   10/2005
JP   2008-053414 A    3/2008
(Continued)

OTHER PUBLICATIONS

Jul. 31, 2018 International Search Report issued in International Patent Application No. PCT/JP2018/023760.

*Primary Examiner* — Jiong-Ping Lu
(74) *Attorney, Agent, or Firm* — Oliff PLC (57) ABSTRACT

A polishing method for polishing by sliding a semiconductor silicon wafer, held by a polishing head, against a polishing pad attached to a turn table while supplying a polishing agent, wherein the semiconductor silicon wafer is subjected to primary polishing, secondary polishing, and final polishing in turn, the secondary polishing comprises polishing by an alkaline based polishing agent which includes free abrasive grains and does not include a water-soluble polymer agent, and subsequent rinse polishing by a polishing agent which includes a water-soluble polymer agent and the rinse polishing includes two stages of polishing, wherein, after performing a first stage of the rinse polishing while supplying a polishing agent which includes a water-soluble polymer agent, a second stage of the rinse polishing is performed while supplying a switched polishing agent whose water-soluble polymer agent has an average molecular weight larger than the polishing agent of the first stage.

18 Claims, 5 Drawing Sheets

(51) Int. Cl.
*C09G 1/02* (2006.01)
*C11D 7/26* (2006.01)
*C11D 11/00* (2006.01)
*C09G 1/00* (2006.01)
*C09G 1/06* (2006.01)
*C09K 13/06* (2006.01)
*B24B 1/00* (2006.01)
*C09G 1/04* (2006.01)
*C09K 3/14* (2006.01)
*H01L 21/321* (2006.01)

(52) U.S. Cl.
CPC .............. *B24B 37/044* (2013.01); *C09G 1/00* (2013.01); *C09G 1/02* (2013.01); *C09G 1/04* (2013.01); *C09G 1/06* (2013.01); *C09K 3/1454* (2013.01); *C09K 3/1463* (2013.01); *C09K 13/06* (2013.01); *C11D 7/268* (2013.01); *C11D 11/0047* (2013.01); *H01L 21/3212* (2013.01)

(56) References Cited

U.S. PATENT DOCUMENTS

| | | |
|---|---|---|
| 2010/0003821 A1 | 1/2010 | Morinaga et al. |
| 2017/0178888 A1 | 6/2017 | Teramoto et al. |
| 2017/0213742 A1 | 7/2017 | Sato |

FOREIGN PATENT DOCUMENTS

| | | | | |
|---|---|---|---|---|
| JP | 2010-034509 A | | 2/2010 | |
| JP | 2015-159259 A | | 9/2015 | |
| JP | 2015-198112 A | | 11/2015 | |
| JP | 2016-001705 A | | 1/2016 | |
| JP | 2016-004953 A | | 1/2016 | |
| JP | 2016-039179 A | | 3/2016 | |
| WO | WO2011142362 | * | 11/2011 | ............. B24B 37/00 |

* cited by examiner

POLISHING METHOD

TECHNICAL FIELD

The present invention relates to a method for polishing a semiconductor silicon wafer.

BACKGROUND ART

Figure 4:
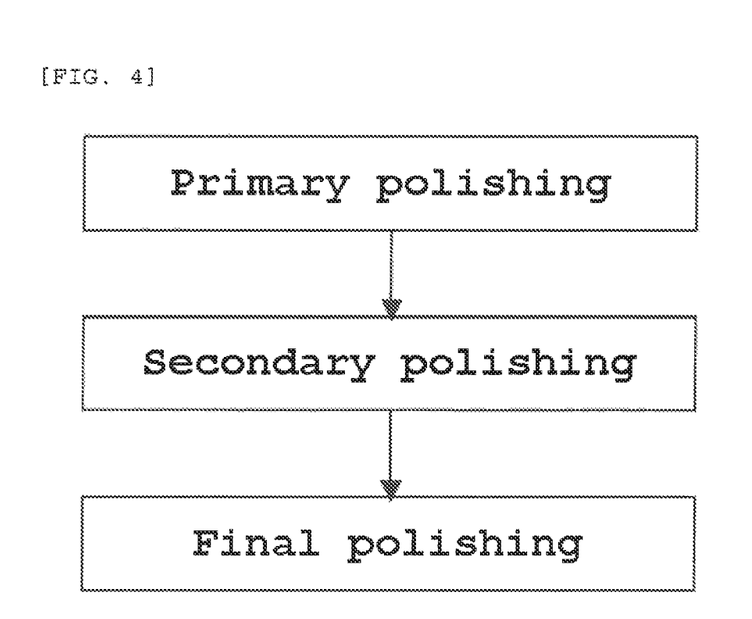
FIG. 4 is a flow diagram showing an example of a conventional polishing method.

A semiconductor silicon wafer (hereinafter also referred to as simply a silicon wafer or a wafer) is usually polished in multiple stages, changing types of polishing pad or polishing agent. In such a case, as shown in FIG. 4, the polishing that is performed first may be called primary polishing, the polishing that is performed after the primary polishing may be called secondary polishing, and the last polishing that is performed after the secondary polishing may be called final polishing. Hereinafter, the terms of primary polishing, secondary polishing, and final polishing will be used in the description.

The primary polishing process is generally performed on a double side polishing machine which has hard polishing pads made of non-woven fabric or urethane foam attached to the upper and lower turn tables. The wafer is held inside a hole of a carrier, the carrier is in an interposed state between upper and lower turn tables, the polishing agent is dropped between the upper and lower turn tables while rotating in opposite directions to one another, and the carrier also rotates and revolves, whereby both the front and back surfaces of the wafer are polished simultaneously. The carrier gains rotary driving force from a sun gear and an internal gear that are on the internal circumference and the external circumference of the upper and lower turn tables. As the polishing agent, an alkaline based polishing agent that includes free abrasive grains such as colloidal silica is used.

In the secondary polishing process, polishing is performed on a single side polishing apparatus by pressing a polishing head in which the wafer is held against a turn table which has a polishing pad attached, dropping an alkaline based polishing agent which includes free abrasive grains such as colloidal silica, and rotating and sliding against one another. A polishing pad made of hard non-woven fabric or urethane foam is generally used in the secondary polishing as well.

Immediately before the end of the polishing in the primary polishing or the secondary polishing, in order to suppress etching and adhesion of foreign substances of the wafer surface due to the primary polishing agent or the secondary polishing agent, polishing is performed using a polishing agent which includes water-soluble polymer cellulose such as hydroxyethyl cellulose (HEC) for the purpose of hydrophilizing the wafer surface. This polishing may be called rinse polishing. In addition, the polishing agent that is used at this time is called rinse polishing agent.

The final polishing process is performed on a single side polishing apparatus as with the secondary polishing. Here, one purpose of the final polishing is to improve surface roughness of the wafer, especially fine roughness called haze which has a spatial wavelength of a few microns or less while reducing surface defects.

Polishing agents which include water-soluble polymer such as hydroxyethyl cellulose are known to have the effect of improving wafer surface roughness which has a short spatial wavelength such as haze (Patent Document 1). This is because water-soluble polymer, adsorbed on the wafer surface, has the function of suppressing polishing of that portion of the wafer, and the polymer that adheres to a convex portion of a concave and convex portion which is a wafer roughness component is easily delaminated due to contact with the polishing pad so that this portion is polished. On the other hand, the concave portion does not get polished because the water-soluble polymer is retained. It can be conjectured that, as a result, the convex portion is selectively polished, whereby the wafer surface roughness is improved.

For this reason, in the final polishing, the polishing is performed using a polishing agent which includes water-soluble polymer such as hydroxyethyl cellulose and a soft polishing pad such as a suede type one.

Here, hydroxyethyl cellulose which has a large average molecular weight (for example 1,000,000 or more) becomes a medium itself in the solution and tends to cause agglomeration of the free abrasive grains in the polishing agent, and there is a problem that polishing with such a polishing agent makes minute surface defects (micro scratches) liable to be generated on the wafer surface.

Therefore, as a means to salve this problem, a method using a polishing agent which includes hydroxyethyl cellulose with a small average molecular weight or a method of reducing agglomeration by filtering additionally is sometimes adopted (Patent Document 2).

On the other hand, hydroxyethyl cellulose with a small average molecular weight (for example 400,000 or less) has a weak adsorption to the wafer surface, that is, it has a low protective performance of the wafer surface. Especially when mechanical action in a polishing is strong, for example, when a hard polishing pad is used and when the wafer load is high or when the turn table or the polishing head have a high rotating speed at the time of polishing, the water-soluble polymer adhered to the wafer surface is delaminated and protection of the wafer surface is not enough, and etching of the wafer surface leads to the increase of quality failure such as haze unevenness, slurry burn, or defects with gradual convex or concave shapes called Differential Interference Contrast (DIC) defects.

CITATION LIST

Patent Literature

Patent Document 1: Japanese Unexamined Patent Application publication No. 2008-053414
Patent Document 2: Japanese Unexamined Patent Application publication No. 2010-34509

SUMMARY OF INVENTION

Technical Problem

The object of the present invention is to provide a method for polishing a semiconductor silicon wafer with few minute defects on the wafer surface, few DIC defects, and good surface roughness.

Solution to Problem

To achieve the above object, the present invention provides a polishing method for polishing a semiconductor silicon wafer by sliding the semiconductor silicon wafer, held by a polishing head, against a polishing pad attached to a turn table while supplying a polishing agent, wherein when the semiconductor silicon wafer is subjected to primary polishing, secondary polishing, and final polishing in turn, the secondary polishing comprises polishing by an alkaline based polishing agent which includes free abrasive grains and does not include a water-soluble polymer agent, and subsequent rinse polishing by a polishing agent which includes a water-soluble polymer agent and the rinse polishing comprises two stages of polishing, wherein, after performing a first stage of the rinse polishing while supplying a polishing agent which includes a water-soluble polymer agent, a second stage of the rinse polishing is performed while supplying a switched polishing agent whose water-soluble polymer agent has an average molecular weight larger than the polishing agent of the first stage.

With such a polishing method, the silicon wafer after the secondary polishing can have few minute defects or DIC defects on the wafer surface, and the surface roughness can be improved. In addition, as a result, a good silicon wafer regarding the above minute defect, DIC defect, and surface roughness can also be obtained after the final polishing without changing the polishing conditions of the final polishing.

At this time, the free abrasive grains may be colloidal silica.

Colloidal silica is often used as the free abrasive grains in the secondary polishing and can be easily prepared.

In addition, the water-soluble polymer agent may be hydroxyethyl cellulose.

Hydroxyethyl cellulose is often used as the water-soluble polymer agent in the rinse polishing agent and can be easily prepared. In addition, the wafer can be protected and have its surface roughness improved efficiently.

In addition, the polishing agent of the first stage of the rinse polishing may include a water-soluble polymer agent with an average molecular weight of 200,000 or more and less than 700,000, and the polishing agent of the second stage of the rinse polishing may include a water-soluble polymer agent with an average molecular weight of 700,000 or more and 1500,000 or less.

By so setting the average molecular weight of the water-soluble polymer agent in the polishing agent of the first stage of the rinse polishing to the above range, degradation of the number of minute defects can be suppressed more efficiently, and in addition, surface roughness can be improved more effectively.

In addition, by setting the average molecular weight of the water-soluble polymer agent in the polishing agent of the second stage of the rinse polishing to the above range, the wafer surface can be protected well enough, and the degradation of the number of DIC defects can be more effectively suppressed.

In addition, values of a polishing load, turn table rotating speed, and polishing head rotating speed in the first stage of rinse polishing may be within ±30% of values in the polishing by the alkaline based polishing agent.

In this manner, reduction in the productivity of polished wafers can be prevented effectively, and surface roughness after the secondary polishing and after the final polishing can be improved.

In addition, values of a polishing load, turn table rotating speed, and polishing head rotating speed in the second stage of rinse polishing may be 70% or less of values in the polishing by the alkaline based polishing agent.

In this manner, the wafer surface can be more efficiently protected with the water-soluble polymer agent, and degradation of surface defects such as minute defects and DIC defects can be prevented even more.

Advantageous Effects of Invention

As described above, the inventive polishing method can make the silicon wafer after the secondary polishing and after the final polishing have a reduced number of minute defects and DIC defects, and good surface roughness.

DESCRIPTION OF EMBODIMENTS

Hereinafter, the inventive polishing method will be described in detail as an example of an embodiment with reference to the drawings, but the present invention is not limited thereto.

Figure 3:
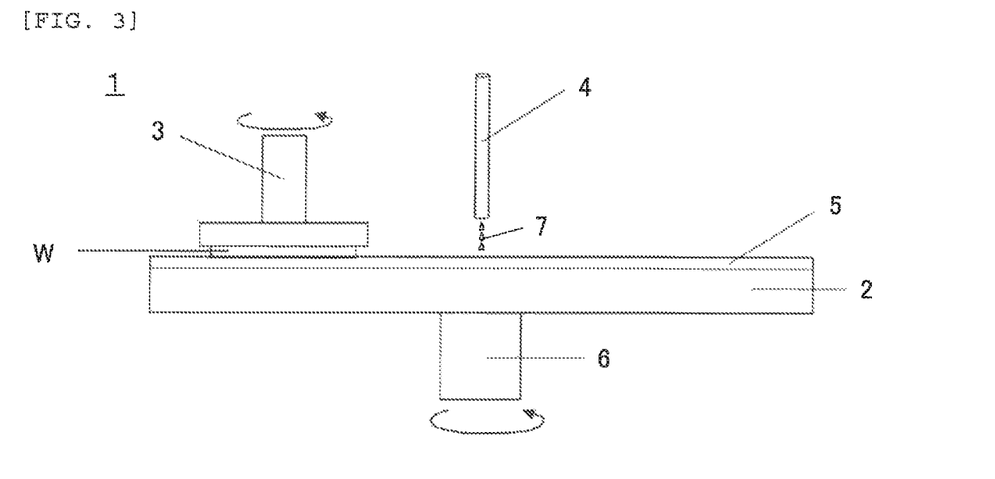
FIG. 3 is a schematic diagram showing an example of a polishing apparatus that may be used in the secondary polishing of the present invention.

FIG. 3 shows a polishing apparatus that may be used in the secondary polishing of the inventive polishing method. The polishing apparatus 1 is a single side polishing apparatus, and is composed of a turn table 2 which has a polishing pad 5 attached, a polishing head 3, and a polishing agent supply mechanism 4. The turn table 2 can be rotated by the rotation of a rotary shaft 6, and in addition, the polishing head 3 can also be rotated.

A semiconductor silicon wafer W is polished by supplying a polishing agent 7 from the polishing agent supply mechanism 4 while sliding the wafer W, which is held by the polishing head 3, against the polishing pad 5 and rotating the turn table 2 and the polishing head 3. The polishing agent supply mechanism 4 can switch several types of polishing agent successively during polishing.

It is to be noted that in the primary polishing, a double side polishing machine may be used, for example. The double side polishing machine is equipped with upper and lower turn tables, a carrier which has a hole for holding a wafer, and a sun gear and internal gear for rotating the carrier between the upper and lower turn tables.

At the time of the polishing, the wafer is held by the carrier in an interposed state between the upper and lower turn tables, and the polishing agent is dropped between the upper and lower turn tables while rotating in opposite directions to one another, and the carrier also rotates and revolves, whereby both the front and back surfaces of the wafer are polished simultaneously.

In addition, in the final polishing, a single side polishing apparatus may be used as in the secondary polishing. A different polishing pad to that in the secondary polishing may be used, and a different polishing agent may be supplied.

It is to be noted that the apparatuses themselves used in the primary polishing, secondary polishing, and final polishing may be, for example, the same as conventional ones.

Figure 1:
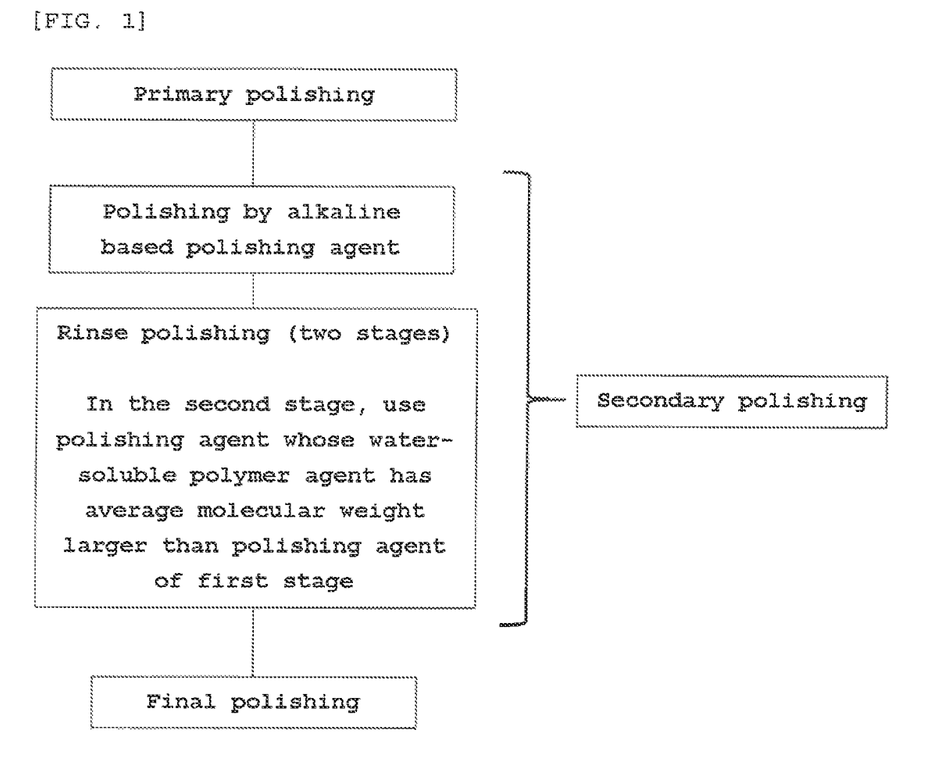
FIG. 1 is a flow diagram showing an example of the inventive polishing method.

Next, the inventive polishing method is described. An example of the process of the inventive polishing method is shown in FIG. 1. As shown in FIG. 1, the process is roughly formed of three parts, primary polishing, secondary polishing, and final polishing.

[Regarding Primary Polishing]

Firstly, regarding the primary polishing, this process itself is not particularly limited, and for example, the same double side polishing machine as is conventional may be used, and the wafer may be subjected to double side polishing under polishing conditions the same as is conventional (types of polishing pad and polishing agent, polishing load, rotating speed of upper and lower turn tables, polishing duration etc.). These may be determined appropriately so as to obtain the desired quality.

[Regarding Secondary Polishing]

Next, the secondary polishing is described. The secondary polishing includes polishing by an alkaline based polishing agent and rinse polishing performed subsequently.

(Polishing by an Alkaline Based Polishing Agent)

In the secondary polishing, in the polishing by an alkaline based polishing agent which is performed first, an alkaline based polishing agent which includes free abrasive grains and does not include a water-soluble polymer agent is used. As the free abrasive grains, for example, colloidal silica which is often used and can be relatively easily prepared may be used.

As colloidal silica, those with an average primary particle size of, for example, about 38 nm by a BET method may be used. This is because if the primary particle size of the colloidal silica is less than 20 nm, surface roughness is improved but the polishing rate is lowered and productivity becomes liable to degradation. In addition, since silica becomes liable to agglomerate, surface defects tend to increase as well. On the other hand, if the primary particle size is 50 nm or more, surface roughness becomes liable to degradation. Therefore, the primary particle size of the colloidal silica is preferably within the range of 20 nm to 40 nm considering productivity, surface roughness, and surface defects. By using colloidal silica of such a range, productivity can be further increased and surface roughness and surface defects can be more effectively improved.

In addition, if the pH of the polishing agent becomes lower than 9, the zeta potential of the colloidal silica comes near 0 and the repulsive force between particles weakens, which makes aggromeration more liable to happen. On the other hand, if the pH becomes higher than 12, the colloidal silica becomes liable to dissolve into the solution. Due to the above, it is preferable to adjust the pH of this alkaline based polishing agent so as to fit within the range of 9 to 12, and it is more preferable to adjust within the range of 10 to 11. Adjustment of pH may be performed by adding a KOH solution.

In addition, concerning other polishing conditions such as polishing load, they may be determined on each occasion depending on the desired quality.

(Rinse Polishing)

Next, the polishing agent is switched and the rinse polishing is performed. This rinse polishing includes two stages of polishing. These are the first stage of the rinse polishing in which a polishing agent which includes a water-soluble polymer agent is used, and the second stage of the rinse polishing in which a polishing agent whose water-soluble polymer agent has an average molecular weight larger than the polishing agent of the first stage is used.

It is to be noted that the water-soluble polymer agent is not particularly limited, but for example, hydroxyethyl cellulose (HEC), hydroxypropyl cellulose (HPC), or carboxymethyl cellulose (CMC) may be used. These are often used as rinse polishing agents and can efficiently protect or improve surface roughness of the wafer. The following description will take a case using hydroxyethyl cellulose as an example.

Firstly, regarding the first stage of the rinse polishing, it has been observed that when polishing is performed while supplying a switched polishing agent which includes hydroxyethyl cellulose which has an average molecular weight of, for example, 200,000 or more and less than 700,000, wafer surface roughness can be effectively improved. In addition, degradation in the number of minute defects after the secondary polishing and after the final polishing can be more effectively prevented.

At this time, in order to avoid losing productivity as much as possible, the polishing load, the turn table rotating speed, and the polishing head rotating speed are preferably under the same conditions or within ±30% of the conditions when alkaline based polishing agent is used before being switched to the rinse polishing agent. In addition, on improving surface roughness, it is preferable to polish under the above conditions for 7 seconds or more, and it is more preferable to polish for 10 seconds or more. By performing the first stage of the rinse polishing under such polishing conditions, even better results concerning improvement of productivity and surface roughness can be obtained.

Subsequently, the second stage of the rinse polishing is performed while supplying a switched polishing agent which includes hydroxyethyl cellulose which has a molecular weight of 700,000 or more and 1500,000 or less. By using hydroxyethyl cellulose which has such an average molecular weight, protective performance on the wafer surface by the hydroxyethyl cellulose can be further enhanced, and generation of partial etching of the wafer surface (slurry burn) and DIC defects can be effectively prevented.

In this case, in order to reduce mechanical action on the wafer and prevent surface defects, the polishing is preferably performed with the polishing load, the turn table rotating speed, and the polishing head rotating speed reduced by 30% or more from the conditions when the alkaline based polishing agent is used (that is, under conditions of 70% or less of the conditions at the time of the polishing by the alkaline based polishing agent), and it is more preferable to reduce by 50% or more. As for the lower limit, it may be, for example, anything greater than 0% of the conditions at the time of the polishing by the alkaline based polishing agent. In addition, since surface protection is the object, the polishing duration is preferably 20 seconds or less and more preferably 15 seconds or less. In this way, the wafer surface can be protected well enough by hydroxyethyl cellulose and degradation of surface quality can be prevented.

Figure 2:
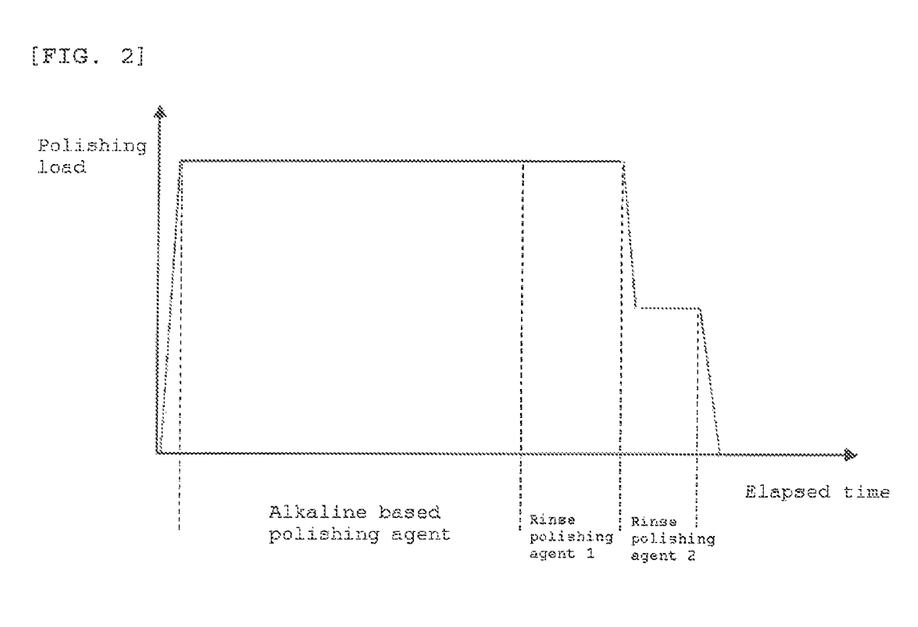
FIG. 2 is a graph showing an example of the change in polishing load in the inventive polishing method.

FIG. 2 shows an example of the change in polishing load in the above polishing method. In this example, in the first stage of the rinse polishing, the condition is the same as the one when the alkaline based polishing agent is used, and in the second stage of the rinse polishing, it is about 50% of the one when the alkaline based polishing agent is used. By adopting such polishing conditions, the above stated effects can be obtained with even more certainty.

In addition, it is desirable to include free abrasive grains such as colloidal silica in the first stage rinse polishing agent in order to promote polishing. However, as a result of research, since the free abrasive grains in the alkaline based polishing agent remain on the polishing pad for a while after switching the polishing agent from the alkaline based polishing agent to the first stage rinse polishing agent, it is not absolutely necessary to include free abrasive grains in this first stage rinse polishing agent. However, since the influence of the remaining abrasive grains is lost if the polishing duration is 30 seconds or more, the duration of the first stage of the rinse polishing is desirably 30 seconds or less when the first stage rinse polishing agent does not include colloidal silica.

The second stage rinse polishing agent does not need to include free abrasive grains from the object of protecting the wafer surface, but even if they are included, there are no problems regarding quality. If they are not included, improvement is possible regarding costs.

At this point, the polishing pad used in the secondary polishing etc. and flatness will be explained.

Figure 5:
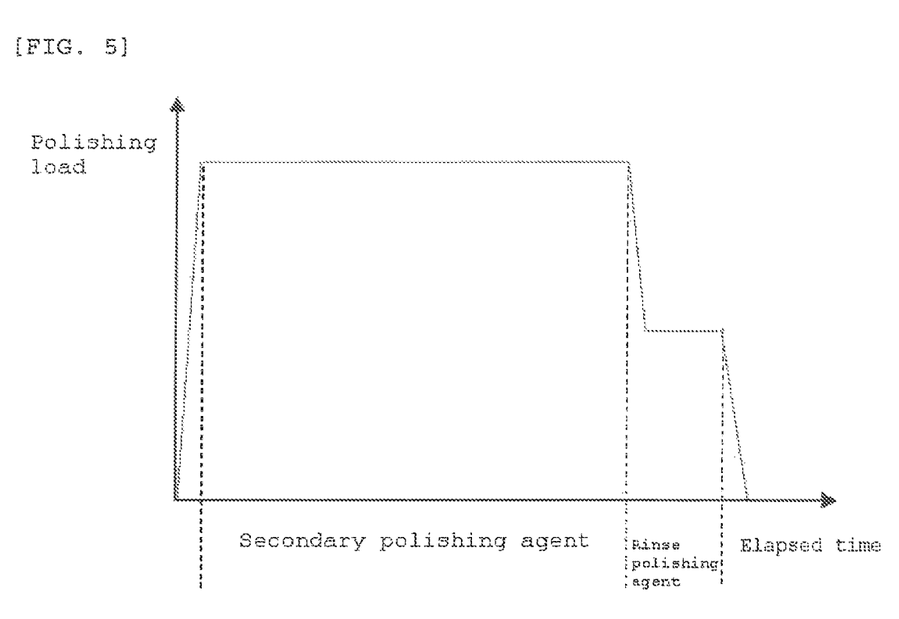
FIG. 5 is a graph showing an example of the change in polishing load in a conventional polishing method.

Conventionally, to counter problems of minute defects and DIC defects, in primary polishing or secondary polishing, it has been common in conventional rinse polishing to use a rinse polishing agent whose hydroxyethyl cellulose has an average molecular weight of about 700,000 to 2,000,000, and as in FIG. 5, to polish for a short time with the wafer polishing load and the polishing pad rotating speed reduced so as not to increase surface defects and to ensure good surface protective performance.

On the other hand, in the subsequent final polishing, for the object of suppressing surface defects, a polishing agent which includes hydroxyethyl cellulose with an average molecular weight of 200,000 or more and less than 700,000 is used. Furthermore, in order to ensure surface protective performance by hydroxyethyl cellulose, the wafer polishing-load is reduced using a soft polishing pad, and the turn table rotating speed and the polishing head rotating speed are reduced, whereby mechanical action in polishing has been reduced and fewer surface defects and good surface roughness have been ensured.

Incidentally, as one quality of a wafer, surface roughness has been repeatedly referred to. Among surface roughness, a type which has a spatial wavelength of a few microns or less called haze is emphasized. This is because, in a surface defect testing apparatus, if the haze level is undesirable, the ratio of the signal strength that can be obtained from the defects on the wafer to the signal strength of the noise (haze) component of the wafer (S/N ratio) becomes small, which hinders minute defect detection. Haze is measured with, for example, SP2 made by KLA Tencor Co., Ltd. etc., and the average value of the whole surface is used as a representative value of the wafer.

However, in recent years, it has been observed that, besides haze, surface roughness which has a spatial wavelength of about a few microns to 50 microns affects the yield when manufacturing devices, and has come to attract attention. Such surface roughness is measured with, for example, TMS3000 RC made by Schmitt Measurement Systems Inc. and the average value of the whole surface is used as a representative roughness of the wafer. Wafer surface roughness of this region can be improved by using a soft polishing pad, and for example, by increasing polishing stock removal in the final polishing which uses a soft polishing pad, it is considered possible to improve this type of wafer surface roughness.

However, increasing the polishing stock removal using such a soft polishing pad causes the problem of increasing the stock removal of a peripheral portion of the wafer and degrading wafer flatness. This is thought to be caused by the following. The wafer which has received polishing load sinks into the soft polishing pad, which raises the repulsive force that the peripheral portion of the wafer receives from the polishing pad, which results in further promotion of polishing of the peripheral portion.

As stated above, usually, a hard polishing pad is often used in the secondary polishing, and in this point, a hard one may be suitably used similarly in the secondary polishing of the present invention as well. In a secondary polishing which uses such a hard polishing pad, flatness not degraded even if the polishing duration is extended in the first stage of the rinse polishing with the switched polishing agent after the polishing by the alkaline based polishing agent in order to improve surface roughness.

Thus, in the conventional method, the attempt to improve surface roughness by changing the conditions of the final polishing which uses a soft polishing pad leads to degradation of flatness, but in the present invention, there is not even the need to change the conditions of the final polishing. In addition, in the secondary polishing in which a hard polishing pad is generally used, surface roughness can be improved without losing flatness.

[Regarding Final Polishing]

The process of the final polishing itself is not particularly limited, and for example, the same single side polishing apparatus as is conventional may be used, and the wafer may be subjected to single side polishing under polishing conditions the same as is conventional (types of polishing pad and polishing agent, polishing load, turn table rotating speed, polishing head rotating speed, polishing duration etc.). These may be determined appropriately so as to obtain the desired quality. It is to be noted that there is also no need to increase the polishing stock removal in the final polishing which uses a soft polishing pad as is conventional, and flatness is not lost either.

Above has been described in detail the inventive polishing method, and by performing the secondary polishing as described above, the surface roughness after the secondary polishing can be improved without degrading wafer flatness or surface defects. In addition, as a result of the roughness after the secondary polishing being improved, surface roughness after the final polishing can also be improved without changing the final polishing conditions.

EXAMPLES

Hereinafter, the present invention will be more specifically described with reference to Examples and Comparative Examples, but the present invention is not limited thereto.

Regarding Examples 1 to 8

The inventive polishing method was performed according to the flow shown in FIG. 1.

As an object for polishing, a semiconductor silicon wafer with a diameter of 300 mm was prepared, and first, the primary polishing was performed using a double side polishing machine. The polishing conditions of this primary polishing are as follows.

As the polishing apparatus, DSP-20B, made by Fujikoshi Machinery Corp. was used. In addition, as the polishing pad, a urethane foam type with an Asker C hardness of 92 was used, and as slurry, an alkaline based type which includes 1.0 wt % of colloidal silica with an average particle size of 38 nm was prepared, and was adjusted with a KOH solution to have PH of 10.5.

Next, the secondary polishing was performed on the wafer subjected to primary polishing, using the polishing apparatus shown in FIG. 3. As the secondary polishing, a polishing by an alkaline based polishing agent, the first stage of rinse polishing, and the second stage of the rinse polishing were performed in turn. As the polishing apparatus, PNX332B made by Okamoto co. ltd. was used.

In addition, as the polishing pad used in the secondary polishing, a non-woven fabric type with an Asker C hardness of 67 after a seasoning treatment was prepared in order to prevent degradation of flatness more effectively. It is to be noted that the seasoning method is not particularly limited in the present invention, but in this case, using a wafer, 60 minutes of continuous polishing was performed under the same polishing load, turn table and polishing head rotating speeds, and polishing agent conditions as the polishing by the alkaline based polishing agent.

In the polishing by the alkaline based polishing agent, as the polishing agent, an alkaline based type which includes colloidal silica which are free abrasive grains was used, and colloidal silica which has an average primary particle size of about 38 nm by a BET method was used. Adjustment of pH was performed using a KOH solution, and a type with a pH of 10.5 was used.

In addition, other polishing conditions will be described in each Example below.

The two types of rinse polishing agent 1 and 2 that were used in the rinse polishing are shown below in Table 1.

In the first stage of the rinse polishing, as the rinse polishing agent 1 for improving surface roughness, an alkaline based polishing agent which includes colloidal silica with an average primary particle size of 38 nm was used. Adjustments were made so that the colloidal silica concentration was 0.4 wt % and the hydroxyethyl cellulose was 0.05 wt %.

In the second stage of the rinse polishing, as the rinse polishing agent 2 for wafer surface protection, a type that does not include free abrasive grains and includes 0.05 wt % of hydroxyethyl cellulose was used.

The average molecular weight of the hydroxyethyl cellulose in the rinse polishing agents 1 and 2 and other polishing conditions will be described in each Example below.

TABLE 1

| Rinse polishing agent 1 | | | Rinse polishing agent 2 | | |
| --- | --- | --- | --- | --- | --- |
| HEC concentration | Average primary particle size of colloidal silica | Colloidal silica concentration | HEC concentration | Average primary particle size of colloidal silica | Colloidal silica concentration |
| 0.05 wt % | 38 nm | 0.4 wt % | 0.05 wt % | Not included | 0% |

After the secondary polishing, the final polishing was performed using a single side polishing apparatus which uses a suede type polishing pad. The polishing conditions of this final polishing are as follows.

A polishing pad with an Asker C hardness of 60 was used, and as slurry, slurry which includes 0.4 wt % of colloidal silica with an average particle size of 38 nm and includes 0.05 wt % of hydroxyethyl cellulose with an average molecular weight of 300,000 was used.

Subsequently, roughness of the wafer surface was measured after cleaning the wafer. Surface roughness was measured on TMS3000 RC made by Schmitt Measurement Systems Inc., and the average value of all the measuring points on the wafer surface was set as a representative roughness of the wafer.

In addition, minute defects and DIC defects were measured on SP2 made by KLA Tencor Co. Ltd.

Hereinafter, the polishing conditions and the resulting quality of the polished wafer in each Example will be described in further detail, but the conditions in which the polishing agent was used in the secondary polishing and the conditions of the final polishing, except for those described below, were performed under the same conditions in every Example below (and Comparative Example to be described below).

It is to be noted that the polishing conditions of the rinse polishing (the HEC average molecular weight of the rinse polishing agents 1 and 2, the polishing load when supplying each polishing agent, the turn table rotating speed, the polishing head rotating speed, and the polishing duration) and the resulting quality of the polished wafer have been summarized in Table 2.

Example 1

In the secondary polishing, polishing was performed for 60 seconds under the conditions: turn table rotating speed of 30 rpm, head rotating speed of 30 rpm, wafer polishing load of 15 kPa, and alkaline based polishing agent of 1000 ml/min in the main polishing which uses an alkaline based polishing agent.

Subsequently, polishing was performed for 20 seconds having only switched the polishing agent to the rinse polishing agent 1 which includes hydroxyethyl cellulose with an average molecular weight of 300,000.

After that, the turn table rotating speed and the head rotating speed were set to 15 rpm and 15 rpm, respectively, and with the wafer load set to 7 kPa, polishing was performed for 10 seconds having switched to the rinse polishing agent 2 which includes hydroxyethyl cellulose with an average molecular weight of 1,000,000.

As a result, the surface roughness after the final polishing was 1.29 Å, and a satisfactory result was obtained. In addition, satisfactory results were obtained for both minute defects and DIC defects.

Example 2

Polishing was performed with the rinse polishing agent 1 under the conditions shown in Table 2, that is, the same conditions as Example 1 except for setting the average molecular weight of the hydroxyethyl cellulose to 200,000, and the quality of the wafer was evaluated.

As a result, satisfactory results were obtained for surface roughness, minute defects, and DIC defects.

Example 3

Polishing was performed with the rinse polishing agent 1 under the conditions shown in Table 2, that is, the same conditions as Example 1 except for setting the average molecular weight of the hydroxyethyl cellulose to 600,000, and the quality of the wafer was evaluated.

As a result, satisfactory results were obtained for surface roughness, minute defects, and DIC defects.

Example 4

Polishing was performed with the rinse polishing agent 2 under the conditions shown in Table 2, that is, the same conditions as Example 1 except for setting the average molecular weight of the hydroxyethyl cellulose to 700,000, and the quality of the wafer was evaluated.

As a result, satisfactory results were obtained for surface roughness, minute defects, and DIC defects.

Example 5

Polishing was performed with the rinse polishing agent 2 under the conditions shown in Table 2, that is, the same conditions as Example 1 except for setting the average molecular weight of the hydroxyethyl cellulose to 1500,000, and the quality of the wafer was evaluated.

As a result, satisfactory results were obtained for surface roughness, minute defects, and DIC defects.

Example 6

Polishing was performed with the rinse polishing agent 1 under the conditions shown in Table 2, that is, the same conditions as Example 1 except for setting the turn table rotating speed and the head rotating speed to 25 rpm each, and the quality of the wafer was evaluated.

As a result, satisfactory results were obtained for surface roughness, minute defects, and DIC defects.

Example 7

Polishing was performed with the rinse polishing agent 1 under the conditions shown in Table 2, that is, the same conditions as Example 1 except for setting the average molecular weight of the hydroxyethyl cellulose to 200,000, setting the turn table rotating speed and the head rotating speed to 35 rpm each, the polishing duration to 15 seconds, and setting the conditions of the rinse polishing agent 2 so that the average molecular weight of the hydroxyethyl cellulose is 700,000, the polishing load is 5 kPa, and the turn table rotating speed and the head rotating speed are each 20 rpm, and the quality of the wafer was evaluated.

As a result, satisfactory results were obtained for surface roughness, minute defects, and DIC defects.

Example 8

Polishing was performed with the rinse polishing agent 1 under the conditions shown in Table 2, that is, the same conditions as Example 1 except for setting the polishing load to 12 kPa, the polishing duration to 30 seconds, and setting the conditions of the rinse polishing agent 2 so that the polishing load is 5 kPa, and the turn table rotating speed and the head rotating speed are each 20 rpm, and the quality of the wafer was evaluated.

As a result, satisfactory results were obtained for surface roughness, minute defects, and DIC defects.

Regarding Comparative Examples 1 to 5

A semiconductor silicon wafer similar to the one in Example 1 was prepared and was subjected to the primary polishing under the same conditions as Example 1. Subsequently, in each Comparative Example, the secondary polishing was performed as shown in Table 2. Detailed conditions of the secondary polishing will be described below. Subsequently, the final polishing was performed under the same conditions as Example 1.

In addition, as in Example 1, roughness of the wafer surface, minute defects, and DIC defects were evaluated after cleaning the wafer.

Comparative Example 1

In Comparative Example 1, as shown in Table 2, polishing was performed under the same conditions as Example 1 except for omitting the polishing by the rinse polishing agent 1 after the polishing by the secondary polishing agent, and the quality of the wafer was evaluated.

As a result, the surface roughness after the final polishing was 1.63 Å, and the result was undesirable compared to the Examples. In addition, satisfactory results were obtained for both minute defects and DIC defects.

Comparative Example 2

Polishing was performed with the rinse polishing agent 2 under the conditions shown in Table 2, that is, the same conditions s Example 1 except for omitting the polishing by the rinse polishing agent 1, setting the polishing load to 15 kPa, the turn table rotating speed and the head rotating speed to 30 rpm each, and the polishing duration to 20 seconds, and the quality of the wafer was evaluated.

As a result, the surface roughness after the final polishing was 1.33 Å, and the result was satisfactory, but the minute defects were degraded. In addition, the number of DIC defects was also slightly increased.

Comparative Example 3

Polishing was performed with the rinse polishing agent 1 under the conditions shown in Table 2, that is, the same conditions as Example 1 except for polishing for 10 seconds with the polishing load set to 7 kPa, and the turn table rotating speed and the head rotating speed to 15 rpm each, and omitting the polishing by the rinse polishing agent 2, and the quality of the wafer was evaluated.

As a result, the surface roughness after the final polishing was 1.61 Å, and was degraded compared to the Examples. Satisfactory results were obtained for minute defects, but the number of DIC defects resulted in degradation.

Comparative Example 4

As shown in Table 2, polishing was performed under the same conditions as Example 1 except for omitting the polishing by the rinse polishing agent 2, and the quality of the wafer was evaluated.

As a result, the surface roughness after the final polishing was 1.32 Å. In addition, satisfactory results were obtained for minute defects, but the DIC defects were degraded compared to the Examples.

Comparative Example 5

The conditions of the rinse polishing agents 1 and 2 were set as the conditions shown in Table 2, that is, the same conditions as Example 1 except for setting the average molecular weight of the hydroxyethyl cellulose in the rinse polishing agent 1 to 1,000,000, and setting the average molecular weight of the hydroxyethyl cellulose in the rinse polishing agent 2 to 300,000.

As a result, the surface roughness after the final polishing was 1.32 Å, and a similar level of quality to the Examples was obtained, but the minute defects and the DIC defects both resulted in degradation compared to the Examples.

TABLE 2

| | Rinse polishing agent 1 | | | | | Rinse polishing agent 2 | | | | | Quality | | |
|---|---|---|---|---|---|---|---|---|---|---|---|---|---|
| | HEC | | Turn | | | HEC | | Turn | | | | | |
| | average molecular weight | Polishing load | table rotating speed | Head rotating speed | Polishing duration | average molecular weight | Polishing load | table rotating speed | Head rotating speed | Polishing duration | Surface roughness | Minute defects | DIC defects |
| Example 1 | 300,000 | 15 kPa | 30 rpm | 30 rpm | 20 seconds | 1,000,000 | 7 kPa | 15 rpm | 15 rpm | 10 seconds | 1.29 Å | ○ | ○ |
| Example 2 | 200,000 | 15 kPa | 30 rpm | 30 rpm | 20 seconds | 1,000,000 | 7 kPa | 15 rpm | 15 rpm | 10 seconds | 1.33 Å | ○ | ○ |
| Example 3 | 600,000 | 15 kPa | 30 rpm | 30 rpm | 20 seconds | 1,000,000 | 7 kPa | 15 rpm | 15 rpm | 10 seconds | 1.31 Å | ○ | ○ |
| Example 4 | 300,000 | 15 kPa | 30 rpm | 30 rpm | 20 seconds | 700,000 | 7 kPa | 15 rpm | 15 rpm | 10 seconds | 1.29 Å | ○ | ○ |
| Example 5 | 300,000 | 15 kPa | 30 rpm | 30 rpm | 20 seconds | 1,500,000 | 7 kPa | 15 rpm | 15 rpm | 10 seconds | 1.28 Å | ○ | ○ |
| Example 6 | 300,000 | 15 kPa | 25 rpm | 25 rpm | 20 seconds | 1,000,000 | 7 kPa | 15 rpm | 15 rpm | 10 seconds | 1.33 Å | ○ | ○ |
| Example 7 | 200,000 | 15 kPa | 35 rpm | 35 rpm | 15 seconds | 700,000 | 5 kPa | 20 rpm | 20 rpm | 10 seconds | 1.31 Å | ○ | ○ |
| Example 8 | 300,000 | 12 kPa | 30 rpm | 30 rpm | 30 seconds | 1,000,000 | 5 kPa | 20 rpm | 20 rpm | 10 seconds | 1.20 Å | ○ | ○ |
| Comparative Example 1 | — | — | — | — | — | 1,000,000 | 7 kPa | 15 rpm | 15 rpm | 10 seconds | 1.63 Å | ○ | ○ |
| Comparative Example 2 | — | — | — | — | — | 1,000,000 | 15 kPa | 30 rpm | 30 rpm | 20 seconds | 1.33 Å | X | Δ |
| Comparative Example 3 | 300,000 | 7 kPa | 15 rpm | 15 rpm | 10 seconds | — | — | — | — | — | 1.61 Å | ○ | X |
| Comparative Example 4 | 300,000 | 15 kPa | 30 rpm | 30 rpm | 20 seconds | — | — | — | — | — | 1.32 Å | ○ | X |
| Comparative Example 5 | 1,000,000 | 15 kPa | 30 rpm | 30 rpm | 20 seconds | 300,000 | 7 kPa | 15 rpm | 15 rpm | 10 seconds | 1.32 Å | X | X |

As stated above, and as shown in Table 2, in each Example, surface roughness was improved, and satisfactory results were obtained regarding minute defects on the surface and DIC defects. In addition, in each Example, flatness was not degraded.

It is to be noted that the present invention is not limited to the above-described embodiments. The embodiments are just examples, and any examples that have substantially the same features and demonstrate the same functions and effects as those in the technical concept disclosed in claims of the present invention are included in the technical scope of the present invention.

The invention claimed is:

1. A polishing method for polishing a semiconductor silicon wafer by sliding the semiconductor silicon wafer, held by a polishing head, against a polishing pad attached to a turn table while supplying a polishing agent, wherein
when the semiconductor silicon wafer is subjected to primary polishing, secondary polishing, and final polishing in turn,
the secondary polishing comprises polishing by an alkaline based polishing agent which includes free abrasive grains and does not include a water-soluble polymer agent, and subsequent rinse polishing by a polishing agent which includes a water-soluble polymer agent and
the rinse polishing comprises two stages of polishing, wherein, after performing a first stage of the rinse polishing while supplying a polishing agent which includes a water-soluble polymer agent, a second stage of the rinse polishing is performed while supplying a switched polishing agent whose water-soluble polymer agent has an average molecular weight larger than the polishing agent of the first stage.

2. The polishing method according to claim 1, wherein the free abrasive grains are colloidal silica.

3. The polishing method according to claim 2, wherein the water-soluble polymer agent is hydroxyethyl cellulose.

4. The polishing method according to claim 3, wherein the polishing agent of the first stage of the rinse polishing includes a water-soluble polymer agent with an average molecular weight of 200,000 or more and less than 700,000, and the polishing agent of the second stage of the rinse polishing includes a water-soluble polymer agent with an average molecular weight of 700,000 or more and 1500,000 or less.

5. The polishing method according to claim 4, wherein values of a polishing load, turn table rotating speed, and polishing head rotating speed in the first stage of rinse polishing are within ±30% of values in the polishing by the alkaline based polishing agent.

6. The polishing method according to claim 5, wherein values of a polishing load, turn table rotating speed, and polishing head rotating speed in the second stage of rinse polishing are 70% or less of values in the polishing by the alkaline based polishing agent.

7. The polishing method according to claim 3, wherein values of a polishing load, turn table rotating speed, and polishing head rotating speed in the first stage of rinse polishing are within ±30% of values in the polishing by the alkaline based polishing agent.

8. The polishing method according to claim 2, wherein the polishing agent of the first stage of the rinse polishing includes a water-soluble polymer agent with an average molecular weight of 200,000 or more and less than 700,000, and the polishing agent of the second stage of the rinse polishing includes a water-soluble polymer agent with an average molecular weight of 700,000 or more and 1500,000 or less.

9. The polishing method according to claim 8, wherein values of a polishing load, turn table rotating speed, and polishing head rotating speed in the first stage of rinse polishing are within ±30% of values in the polishing by the alkaline based polishing agent.

10. The polishing method according to claim 2, wherein values of a polishing load, turn table rotating speed, and polishing head rotating speed in the first stage of rinse polishing are within ±30% of values in the polishing by the alkaline based polishing agent.

11. The polishing method according to claim 1, wherein the water-soluble polymer agent is hydroxyethyl cellulose.

12. The polishing method according to claim 11, wherein the polishing agent of the first stage of the rinse polishing includes a water-soluble polymer agent with an average molecular weight of 200,000 or more and less than 700,000, and the polishing agent of the second stage of the rinse polishing includes a water-soluble polymer agent with an average molecular weight of 700,000 or more and 1500,000 or less.

13. The polishing method according to claim 12, wherein values of a polishing load, turn table rotating speed, and polishing head rotating speed in the first stage of rinse polishing are within ±30% of values in the polishing by the alkaline based polishing agent.

14. The polishing method according to claim 11, wherein values of a polishing load, turn table rotating speed, and polishing head rotating speed in the first stage of rinse polishing are within ±30% of values in the polishing by the alkaline based polishing agent.

15. The polishing method according to claim 1, wherein the polishing agent of the first stage of the rinse polishing includes a water-soluble polymer agent with an average molecular weight of 200,000 or more and less than 700,000, and the polishing agent of the second stage of the rinse polishing includes a water-soluble polymer agent with an average molecular weight of 700,000 or more and 1500,000 or less.

16. The polishing method according to claim 15, wherein values of a polishing load, turn table rotating speed, and polishing head rotating speed in the first stage of rinse polishing are within ±30% of values in the polishing by the alkaline based polishing agent.

17. The polishing method according to claim 1, wherein values of a polishing load, turn table rotating speed, and polishing head rotating speed in the first stage of rinse polishing are within ±30% of values in the polishing by the alkaline based polishing agent.

18. The polishing method according to claim 1, wherein values of a polishing load, turn table rotating speed, and polishing head rotating speed in the second stage of rinse polishing are 70% or less of values in the polishing by the alkaline based polishing agent.

* * * * *